(12) United States Patent
Cepulis et al.

(10) Patent No.: US 8,301,938 B2
(45) Date of Patent: Oct. 30, 2012

(54) MANAGING MEMORY HEALTH

(75) Inventors: Darren J. Cepulis, Houston, TX (US); Andrew C. Cartes, Cypress, TX (US); Andrew Brown, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2266 days.

(21) Appl. No.: 11/085,429

(22) Filed: Mar. 21, 2005

(65) Prior Publication Data
US 2006/0236165 A1    Oct. 19, 2006

(51) Int. Cl.
*G06F 11/00* (2006.01)
(52) U.S. Cl. .......................................................... 714/42
(58) Field of Classification Search .................. None
See application file for complete search history.

(56) References Cited

U.S. PATENT DOCUMENTS

| 5,889,784 | A | | 3/1999 | Rogers |
| 6,000,006 | A | * | 12/1999 | Bruce et al. ................ 711/103 |
| 6,035,432 | A | * | 3/2000 | Jeddeloh ..................... 714/763 |
| 6,467,054 | B1 | | 10/2002 | Lenny |
| 6,804,729 | B2 | | 10/2004 | Swanberg |
| 7,246,269 | B1 | * | 7/2007 | Hamilton ..................... 714/42 |
| 2002/0124142 | A1 | * | 9/2002 | Har et al. ..................... 711/143 |
| 2003/0097608 | A1 | * | 5/2003 | Rodeheffer et al. .......... 714/7 |

* cited by examiner

*Primary Examiner* — Bryce Bonzo

(57) ABSTRACT

Systems, methodologies, media, and other embodiments associated with managing memory health are described. One exemplary system embodiment includes logic for detecting and correcting single bit memory errors. The example system may also include logic for selectively making unavailable a memory location associated with single bit memory errors.

17 Claims, 6 Drawing Sheets

MANAGING MEMORY HEALTH

BACKGROUND

Memory in a computer system may experience single bit correctable errors. If these errors are not corrected in a timely manner, they may become more serious uncorrectable multi-bit errors. Some types of memory failures may be predictable based on data like the number of errors, error frequency, change in error frequency, and other telltale signals. Conventional memory protection techniques may address these predictable memory failures through physical redundancy. For example, additional hardware may be used to reconstruct data in failing memory locations and additional memory chips may be used to store the reconstructed data. These and related techniques like on-line sparing, mirroring, RAIDing, and so on require additional memory and additional hardware support. Furthermore, these techniques tend to be isolated from application and/or operating system level processes.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
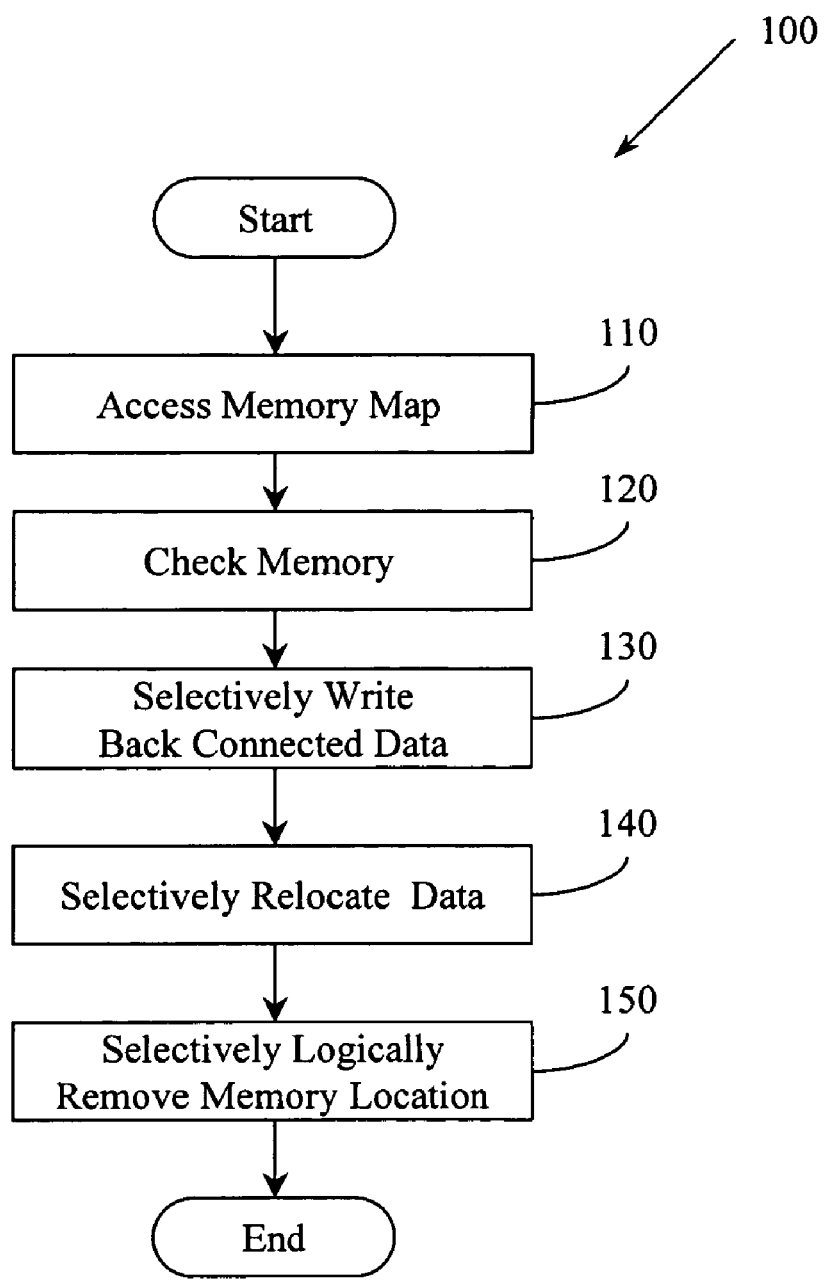
FIG. 1 illustrates an example method associated with managing memory health.

Memory in a computer system may experience single bit correctable errors. If these errors are not corrected in a timely manner, they may become more serious uncorrectable multi-bit errors. Thus, example systems and methods may access system memory to detect and correct single bit memory errors. The access may be done in response to a user command, substantially constantly, periodically, and so on. Some types of memory failures may be predictable based on the number of errors, frequency of errors, change in error frequency, and other telltale signals. Thus, unlike conventional systems that simply detect and correct, example systems and methods may also report data concerning the detecting and correcting to a process like an application or operating system procedure. The reporting may include placing a data item in a data store, passing a data value to a process, and so on. Thus, the receiving process may determine whether to make certain memory locations inaccessible by, for example, logically removing the memory locations from the system. Upon determining that a certain location(s) is to be made unavailable, the process may copy data from the locations to other memory locations and update a memory map(s) so that subsequent accesses to the data are addressed to the new memory locations rather than the old, now unavailable memory locations. A location may be selected for logical removal based on statistics like a number of errors, error frequency, a change in error frequency, and so on. Thus, the process prevents an operating system from allocating suspect memory regions which in turn facilitates reducing potential memory related failures. In one example, the process may be configured to account for interleaving and aliasing in the system memory.

Example systems, methods, media, and other embodiments are described herein that relate to managing memory health. In one example, a logic in a computing system detects and corrects single bit memory errors and communicates information concerning the detection and correction to an application level and/or operating system level process. In the example, the process and/or another logic may selectively make unavailable a memory location(s) associated with detected and corrected single bit memory errors. In different computing systems, the memory location may be associated with a DRAM (dynamic random access memory) chip(s), a DIMM (dual in-lien memory module), a bank of DIMMs, and so on. In one example, the process may have access to operating system interfaces and/or processes for allocating physical memory, mapping virtual to physical memory, and swapping memory.

The following includes definitions of selected terms employed herein. The definitions include various examples and/or forms of components that fall within the scope of a term and that may be used for implementation. The examples are not intended to be limiting. Both singular and plural forms of terms may be within the definitions.

As used in this application, the term "computer component" refers to a computer-related entity, either hardware, firmware, software, a combination thereof, or software in execution. For example, a computer component can be, but is not limited to being, a process running on a processor, a processor, an object, an executable, a thread of execution, a program, and a computer. By way of illustration, both an application running on a server and the server can be computer components. One or more computer components can reside within a process and/or thread of execution and a computer component can be localized on one computer and/or distributed between two or more computers.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, semiconductor memories, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM (random access memory), a ROM (read only memory), an EPROM (electrically programmable ROM), a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), an analog circuit, a digital circuit, a programmed logic device, a memory device containing instructions, or the like. Logic may include one or more gates, combinations of gates, or other circuit components. In some examples, logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend, for example, on requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein include programming languages and tools like Java, Pascal, C#, C++, C, CGI, Perl, SQL, APIs, SDKs, assembly, firmware, microcode, and/or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a web server to a user. In another example, the computer-readable medium has a form of the software/firmware as it is maintained on the web server. Other forms may also be used.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various actions occurring in serial, it is to be appreciated that various actions could occur concurrently, substantially in parallel, and/or at different points in time. In one example, the processing blocks may represent executable instructions that cause a computer, processor, and/or logic device to respond, to perform an action(s), to change states, and/or to make decisions. Thus, the described methodologies can be implemented as processor executable instructions and/or operations provided by a computer-readable medium. In another example, the processing blocks may represent functions and/or actions performed by functionally equivalent circuits like an analog circuit, a digital signal processor circuit, an application specific integrated circuit (ASIC), or other logic device.

FIG. 1 illustrates an example method 100 for managing the health of memory in a computing system. The computing system may be, for example, a system that includes a processor and a memory like a computer, a printer, a camera, a personal digital assistant, a telephone, and so on. In one example, method 100 may be performed by a logic (e.g., integrated circuit, Option ROM) that has bus master capability in the computing system. For example, the logic may be an embedded management controller like a management processor (MP), an integrated lights out (iLO) logic, and a baseboard management controller (BMC). Thus, the logic may be configured to operate independently of other components in the computing system like an operating system, a processor, and so on.

Method 100 may include, at 110, accessing a memory map associated with the computing system. The memory map may describe, for example, available physical memory addresses, relationships between virtual memory addresses and physical memory addresses, memory interleaving, memory aliasing, and so on. The memory map may be stored, for example, in a data store like a ROM, a memory, and so on. In some examples, method 100 may be able to manipulate the memory map after detecting, correcting, and reporting on correctable single bit memory errors. Accessing the memory map may include, for example, making a call to a ROM BIOS (Read Only Memory Basic Input Output System) associated with the computing system.

Method 100 may also include, at 120, selectively checking a memory location identified in the memory map for a correctable single bit memory error. Checking a memory location for a correctable single bit memory error may include, for example, analyzing a parity bit associated with the memory location, analyzing an error correcting code (ECC) bit associated with the memory location, and performing a memory read with ECC bit validation of the memory location. In different examples, method 100 may check memory locations at times including, but not limited to, periodically, constantly, substantially constantly, according to a configurable schedule, and in response to a user command. In one example, method 100 may consider whether a memory location is associated with a register that may have a read and/or write effect. Thus, in the example, method 100 may selectively omit checking such memory locations.

Checking the memory location may be performed without involving a processor and/or operating system. However, in one example, to minimize potential delays associated with competing for access to a memory location, method 100 may be processor load aware. In one example, upon detecting that a processor in the computing system is running at a first, lower level that indicates that memory accesses may be occurring at a first, lower level, method 100 may substantially constantly check memory. In another example, upon detecting that a processor in the computing system is running at a second, higher level that indicates that memory accesses may be occurring at a second, higher level, method 100 may check memory less frequently.

Method 100 may also include, at 130, selectively causing a corrected data to be written back to the memory location that was checked at 120. The corrected data may be written back, for example, upon detecting a correctable single bit error. Writing back the corrected data may include, for example, performing an action associated with a ROM (read only memory) SMI (system management interrupt) and/or performing an action provided by a chipset associated with the computing system. Thus, writing back the corrected data may be achieved without involving the processor and/or operating system in the computing system.

Method 100 may also include, at 140, upon determining that a likelihood that the memory location will experience a memory failure exceeds a threshold, selectively causing data stored in the memory location to be relocated and, at 150, making the memory location logically inaccessible to the computing system. The threshold may concern, for example, how many errors the memory location has experienced, how frequently the location is experiencing an error, changes in the frequency of errors experienced by a location, how many errors have been experienced by a chip on which the memory location is implemented, and so on. Causing the data to be relocated may be achieved, for example, using operating system capabilities, direct memory access capabilities, and so on. Making the memory location logically inaccessible may include, for example, manipulating the memory map, assigning the memory location to a pseudo-process that never actually accesses the location, and so on.

Method 100 may also include, (not illustrated), selectively manipulating a non-volatile memory location to record the detecting of the correctable single bit error. Manipulating a non-volatile memory location facilitates having method 100 operate at times including when an operating system is not running on the computing system and when a processor may not have been initialized or available on the computing system. Thus, method 100 may run at boot time as, for example, part of a power on self test (POST). Method 100 may run when an operating system is not running but may also run when an operating system is running. Thus, method 100 may include different approaches for notifying the operating system concerning its operations involving detecting and correcting the correctable single bit error. In one example, method 100 may provide a real time signal to the operating system while in another example method 100 may store data in a data store that the operating system can examine. Thus, communication between method 100 and the operating system may be achieved in real time and/or delayed time directly and/or indirectly.

In one example, method 100 may be provided in an Option ROM as firmware. In another example, method 100 may be retrieved from, for example, a web server to which the computing system is operably connected. Thus, method 100 may be user configurable with respect to parameters like a memory checking protocol, a write back protocol, threshold configuration, data relocation protocol, and so on.

While FIG. 1 illustrates various actions occurring in serial, it is to be appreciated that various actions illustrated in FIG. 1 could occur substantially in parallel. By way of illustration, a first process could detect single bit correctable errors, a second process could correct the errors and a third process could selectively relocate memory. While three processes are described, it is to be appreciated that a greater and/or lesser number of processes could be employed and that lightweight processes, regular processes, threads, and other approaches could be employed.

In one example, methodologies are implemented as processor executable instructions and/or operations stored on a computer-readable medium. Thus, in one example, a computer-readable medium may store processor executable instructions operable to perform a method that includes managing the health of memory in a computing system. The instructions may be provided to and/or stored in a logic with bus master capability in the computing system. The logic will have been designed to operate independently of an operating system and a processor associated with the computing system. The method may include accessing a memory map associated with the computing system, selectively checking a memory location identified in the memory map for a correctable single bit memory error, and upon detecting a correctable single bit error, selectively causing a corrected data to be written back to the memory location. The method may also include, upon determining that a likelihood that the memory location will experience a memory failure exceeds a threshold, selectively causing data stored in the memory location to be relocated and to make the memory location logically inaccessible to the computing system. While the above method is described being stored on a computer-readable medium, it is to be appreciated that other example methods described herein can also be stored on a computer-readable medium.

Figure 2:
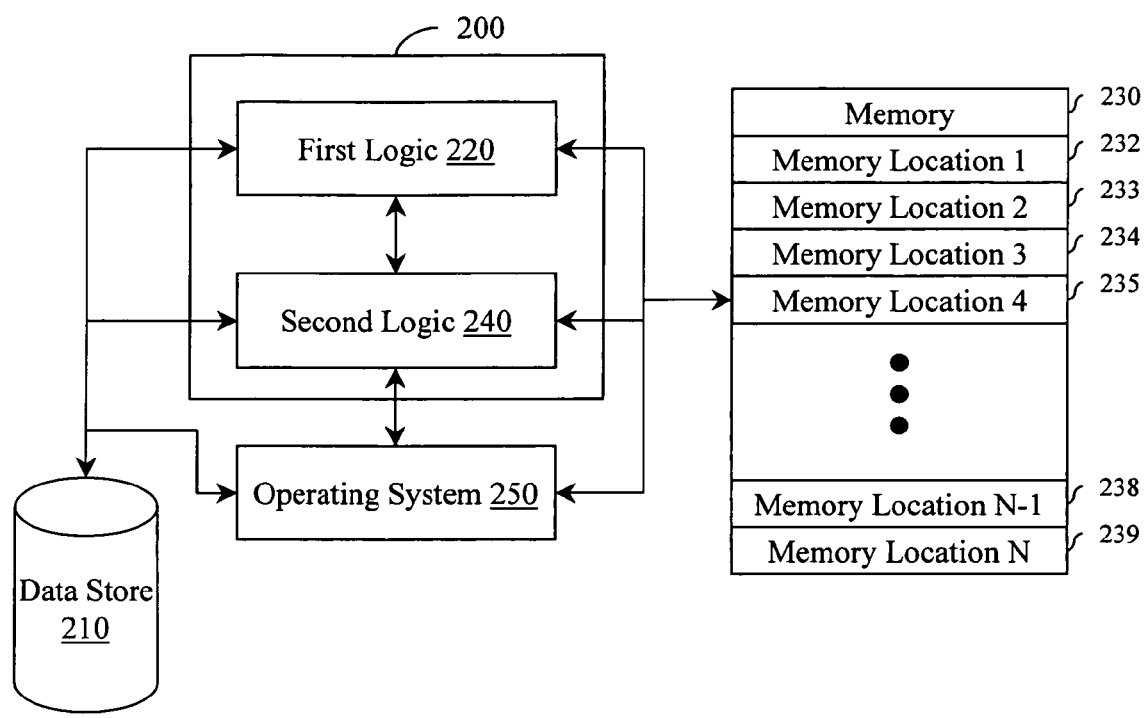
FIG. 2 illustrates an example apparatus for managing memory health.

FIG. 2 illustrates an example apparatus 200 for managing memory health in computing systems having dynamically allocable memory like computers, printers, cameras, telephones, personal digital assistants, and so on. Apparatus 200 may include a first logic 220 that is operably connectable to a computing system that includes a memory 230. First logic 220 may be configured to detect and "scrub" correctable single bit errors in memory locations like locations 232 through 239 in memory 230. In general, scrubbing memory concerns reading from memory locations, detecting single bit memory errors, correcting the single bit memory error and writing the corrected content back to the memory location to prevent single bit errors from adding up into non-correctable multiple bit errors. The memory locations in memory 230 may be described in a memory map stored in a data store 210 associated with the computing system. First logic 220 may be configured with bus master capability in the computing system and thus may access memory 230 without involving a processor in the computing system and may access memory 230 independently of an operating system 250 that may run on the computing system. Detecting a single bit memory error may include, for example, performing a memory read with error correcting code (ECC) bit validation processing.

Apparatus 200 may also include a second logic 240 that is operably connectable to operating system 250 and memory 230. Second logic 240 may be configured to identify a first memory location in memory 230 that exceeds a threshold associated with correctable single bit errors. The threshold may involve data concerning, for example, the number of single bit memory errors a location has experienced, the frequency with which a memory location experiences single bit memory errors, a change in frequency with which a memory location experiences single bit memory errors, and so on. When second logic 240 identifies the first memory location, it may selectively relocate data in the first memory location to a second memory location in memory 230. Additionally, second logic 240 may selectively logically remove the first memory location from memory 230. Logically removing the first memory location from memory 230 may include actions like manipulating the memory map and assigning the first memory location to a pseudo-process. Manipulating the memory map may involve, for example, removing the first memory location from the memory map, redirecting requests for the first memory location to healthy memory locations, and so on. A pseudo-process may be, for example, a process that is never allocated to run, that has no instructions, and that will never access memory. Allocating memory to a pseudo-process may facilitate logically removing the first memory location from a computing system. Then, if a physical memory chip associated with the first memory location is replaced, the pseudo-process may be "killed", and the new memory logically returned to the computing system.

In one example, first logic 220 may be part of an embedded controller with bus master capability in the computer system. Some embedded controllers include BMC controllers, MPs, iLO controllers, and so on. An iLO controller facilitates accessing computing system hardware even when an operating system is not running on the computing system. One example iLO is configured as a PCI (peripheral component interconnect) bus master with access to system memory. The example iLO may be configured with an option ROM and may have available standard system ROM BIOS support for acquiring a memory map. A baseboard management controller (BMC) facilitates performing power and reset management, again without requiring operating system operation and participation. A BMC may participate in managing system health and thus may include event logging and reporting capabilities. A management processor (MP) may provide a remote interface into a BMC to facilitate managing system resources, diagnosing system health, supporting system repair, and so on. An MP thus may minimize and/or eliminate the requirement that a system administrator (sysadmin) be physically present at a system to work on (e.g., troubleshoot, repair, manage) the system.

In one example, an embedded controller may initiate detecting and scrubbing single bit correctable memory errors without processor (e.g., cpu) or system software (e.g., operating system) support or intervention. The embedded controller may use chipset logic or ROM SMI (system management interrupt) handler logic to perform on-demand scrubbing. For example, reading a memory location in memory 230, where the read is of a location with a detectable single bit memory error, may cause the chipset logic or the ROM SMI logic to validate ECC (error correcting code) bits and to selectively write back corrected data to the memory location, thus scrubbing the location.

Figure 3:
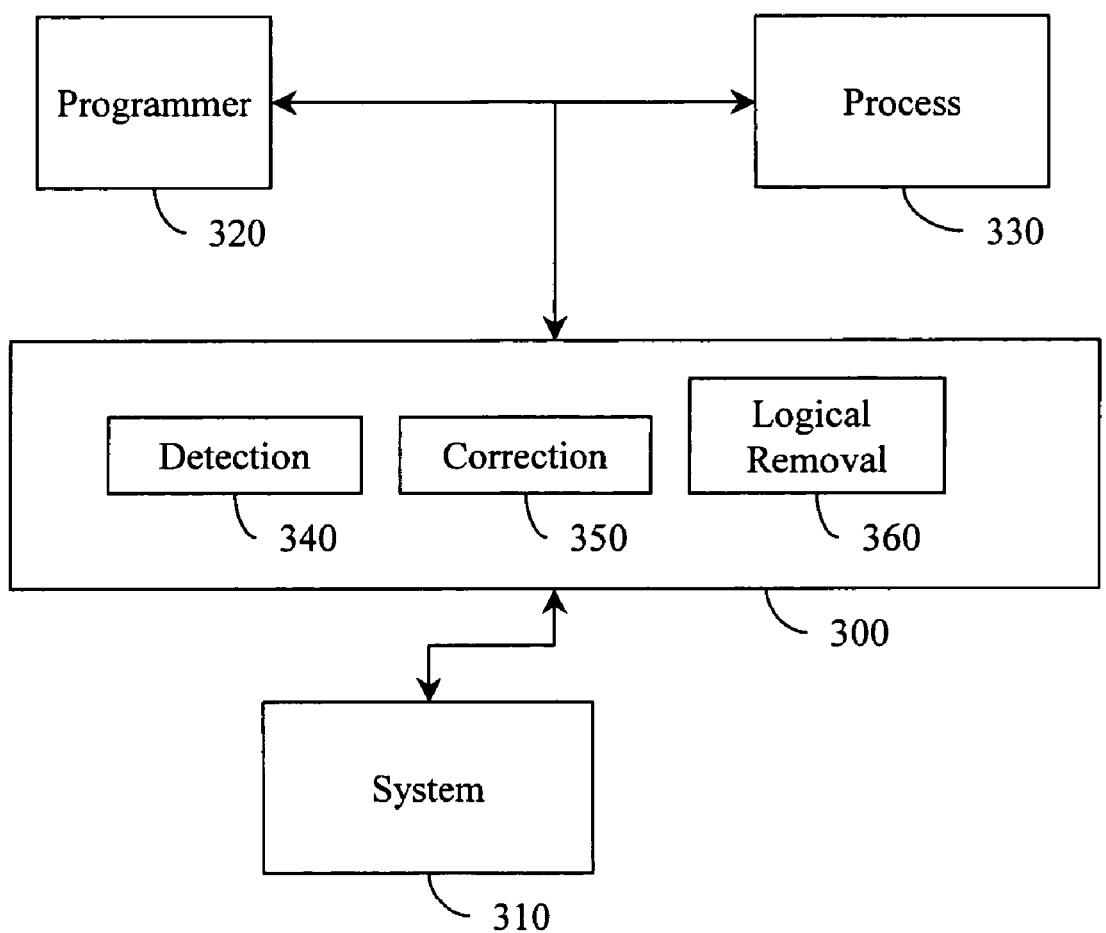
FIG. 3 illustrates an example application programming interface (API).

Referring now to FIG. 3, an application programming interface (API) 300 is illustrated providing access to a system 310 that manages memory health. The API 300 can be employed, for example, by a programmer 320 and/or a process 330 to gain access to processing performed by system 310. For example, a programmer 320 can write a program to access system 310 (e.g., invoke its operation, monitor its operation, control its operation) where writing the program is facilitated by the presence of API 300. Rather than programmer 320 having to understand the internals of system 310, programmer 320 merely has to learn the interface to system 310. This facilitates encapsulating the functionality of system 310 while exposing that functionality.

Similarly, API 300 can be employed to provide data values to system 310 and/or retrieve data values from system 310. Thus, in one example of API 300, a set of application programming interfaces can be stored on a computer-readable medium. The interfaces can be employed by a programmer, computer component, logic, and so on to gain access to system 310 for managing memory health. The interfaces can include, but are not limited to, a first interface 340 that communicates an error detection data, a second interface 350 that communicates an error correction data, and a third interface 360 that communicates a memory relocation data. The error detection data may describe, for example, a memory location in which an error was detected, a time at which the error was detected, a count of how many errors this location has experienced, and so on. The error correction data may describe, for example, a memory location in which an error was corrected, a time at which the error was corrected, how many errors have been corrected for this memory location, and so on. The memory relocation data may identify, for example, a location from which data was relocated, a location to which data was relocated, and so on.

Figure 4:
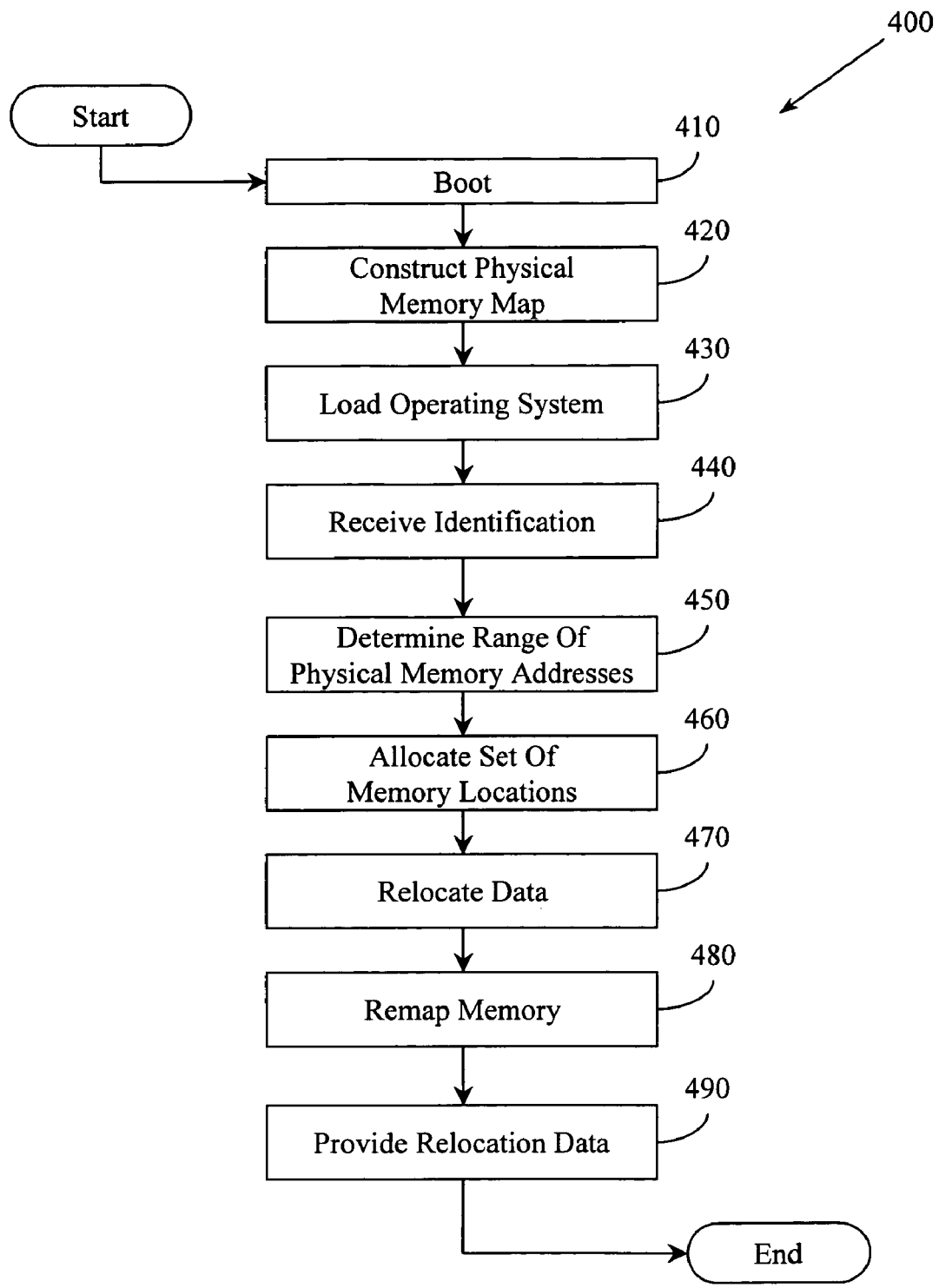
FIG. 4 illustrates an example method associated with managing memory health.

FIG. 4 illustrates an example method 400 associated with managing memory health. Method 400 may include, at 410, booting a computing system. At 420, a physical memory map may be constructed for the computing system. The physical memory map may identify physical memory addresses available to the computing system. These physical addresses may be mapped to virtual addresses by, for example, an operating system that may run on the computing system. Thus, method 400 may also include, at 430, loading an operating system into physical memory in the computing system. Where and how the operating system is loaded into physical memory may depend, at least in part, on the physical memory map.

With the operating system loaded into physical memory, method 400 may also include, at 440, receiving an identification of a memory location(s) that is predicted to experience a memory failure. The identification may be received, for example, from a logic in the computing system. The logic will not be part of a processor in the computing system, and thus, to facilitate accessing memory in the computing system, will be configured with bus master capability in the computing system.

Upon receiving the identification, method 400 may proceed, at 450, to determine a range of physical memory addresses associated with the affected memory location(s). By way of illustration, the memory location(s) may be confined to a single memory chip (e.g., DRAM) with a contiguous range of physical memory addresses. By way of further illustration, the memory location(s) may be spread across a set of DIMMs.

Method 400 may also include, at 460, allocating a set of memory locations to receive data stored in the range of physical memory addresses associated with the failing memory location. With a set of memory locations available to receive data in the failing memory locations, method 400 may proceed, at 470, with relocating data from the range of physical memory addresses associated with the failing memory location to the set of memory locations. In one example, relocating the data may involve operating system processes and processor (e.g., cpu) actions. However, in another example, relocating the data may involve neither the operating system nor the processor by employing direct memory access hardware, and the like.

Having relocated the data, method 400 may include, at 480, remapping the range of physical memory addresses associated with the set of memory locations so that future memory accesses for the failing memory locations will be directed to the location into which the data was relocated. In this way the failing memory may be logically removed form the computing system without requiring physical removal.

To facilitate making the logical removal "persistent" (e.g., effective after subsequent reboots of the computing system) method 400 may include, at 490, making a relocation data available to, for example, a computing system ROM BIOS to facilitate excluding the range of physical memory addresses from the physical memory map on a subsequent system boot.

Figure 5:
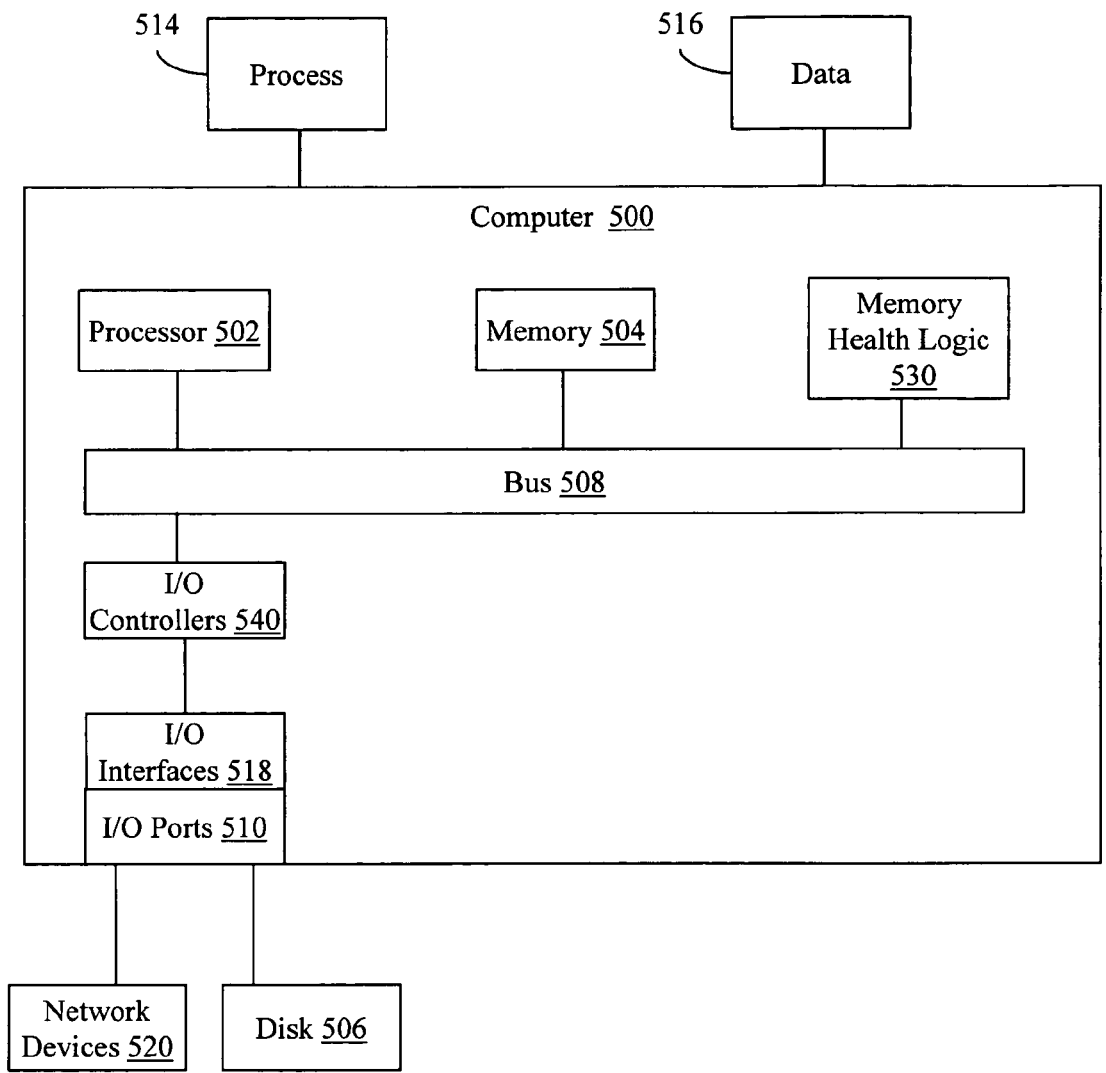
FIG. 5 illustrates an example computing environment in which example systems and methods illustrated herein can operate.

FIG. 5 illustrates an example computing device in which example systems and methods described herein, and equivalents, can operate. The example computing device may be a computer 500 that includes a processor 502, a memory 504, and input/output ports 510 operably connected by a bus 508. In one example, computer 500 may include a memory health logic 530 configured to facilitate detecting, correcting, and reporting on correctable single bit errors in memory 504. In different examples, memory health logic 530 may be permanently and/or removably attached to computer 500.

In one example, memory health logic 530, whether implemented in hardware, software, firmware, and/or combinations thereof, may provide means for detecting a correctable single bit memory error in a computing system, means for correcting the correctable single bit memory error, and means for selectively making unavailable a memory location associated with the correctable single bit memory error.

Generally describing an example configuration of computer 500, processor 502 can be a variety of various processors including dual microprocessor and other multi-processor architectures. The memory 504 can include volatile memory and/or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 506 may be operably connected to the computer 500 via, for example, an input/output interface (e.g., card, device) 518 and an input/output port 510. The disk 506 can include, but is not limited to, devices like a magnetic disk drive, a solid state disk drive, a floppy disk drive, a tape drive, a Zip drive, a flash memory card, and/or a memory stick. Furthermore, the disk 506 can include optical drives like a CD-ROM, a CD recordable drive (CD-R drive), a CD rewriteable drive (CD-RW drive), and/or a digital video ROM drive (DVD ROM). The memory 504 can store processes 514 and/or data 516, for example. The disk 506 and/or memory 504 can store an operating system that controls and allocates resources of the computer 500.

The bus 508 can be a single internal bus interconnect architecture and/or other bus or mesh architectures. While a single bus is illustrated, it is to be appreciated that computer 500 may communicate with various devices, logics, and peripherals using other busses that are not illustrated (e.g., PCIE, SATA, Infiniband, 1394, USB, Ethernet). The bus 508 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 500 may interact with input/output devices via i/o interfaces 518 and input/output ports 510. Input/output devices can include, but are not limited to, a keyboard, a microphone, a pointing and selection device, cameras, video cards, displays, disk 506, network devices 520, and the like. The input/output ports 510 can include but are not limited to, serial ports, parallel ports, and USB ports.

The computer 500 can operate in a network environment and thus may be connected to network devices 520 via the i/o devices 518, and/or the i/o ports 510. Through the network devices 520, the computer 500 may interact with a network. Through the network, the computer 500 may be logically connected to remote computers. The networks with which the computer 500 may interact include, but are not limited to, a local area network (LAN), a wide area network (WAN), and other networks. The network devices 520 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), and the like. Similarly, the network devices 520 can connect to WAN technologies including, but not limited to, point to point links, circuit switching networks like integrated services digital networks (ISDN), packet switching networks, and digital subscriber lines (DSL).

Figure 6:
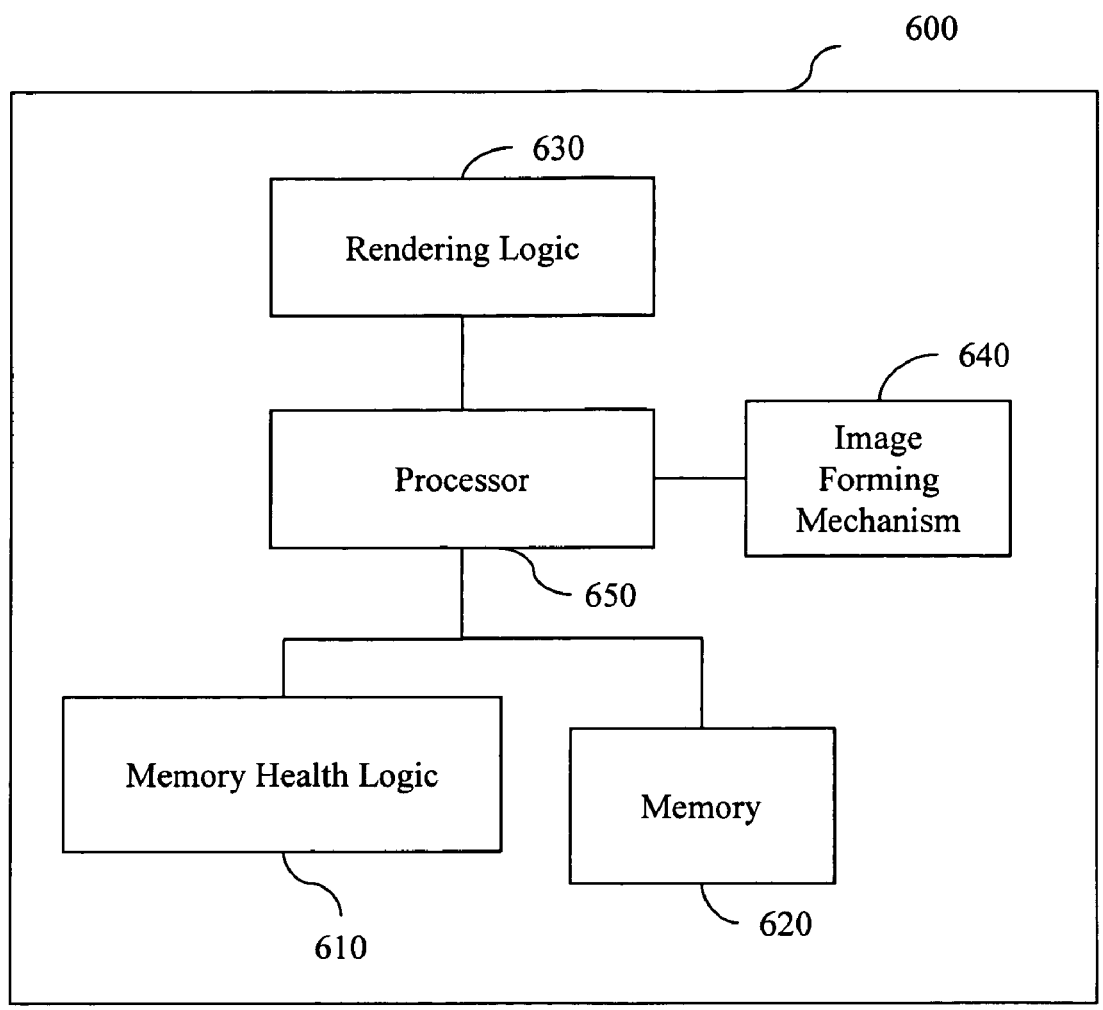
FIG. 6 illustrates an example image forming device in which example systems and methods illustrated herein can operate.

FIG. 6 illustrates an example image forming device 600 that includes a memory health logic 610 that may implement example systems described herein. Memory health logic 610 may be configured to perform executable methods like those described herein. In different examples, memory health logic 610 may be permanently and/or removably attached to image forming device 600. While a computer 500 is illustrated in FIG. 5 and a printer is illustrated in FIG. 6, it is to be appreciated that memory health logics may be associated with and/or incorporated into other computing systems that include memory like telephones, cameras, and so on.

The image forming device 600 may receive print data to be rendered. Thus, image forming device 600 may also include a memory 620 configured to store print data or to be used more generally for image processing. The image forming device 600 may also include a rendering logic 630 configured to generate a printer-ready image from print data. Rendering varies based on the format of the data involved and the type of imaging device. In general, the rendering logic 630 converts high-level data into a graphical image for display or printing (e.g., the print-ready image). For example, one form is ray-tracing that takes a mathematical model of a three-dimensional object or scene and converts it into a bitmap image. Another example is the process of converting HTML into an image for display/printing. It is to be appreciated that the image forming device 600 may receive printer-ready data that does not need to be rendered and thus the rendering logic 630 may not appear in some image forming devices.

The image forming device 600 may also include an image forming mechanism 640 configured to generate an image onto print media from the print-ready image. The image forming mechanism 640 may vary based on the type of the imaging device 600 and may include a laser imaging mechanism, other toner-based imaging mechanisms, an ink jet mechanism, digital imaging mechanism, or other imaging reproduction engine. A processor 650 may be included that is implemented with logic to control the operation of the image-forming device 600. In one example, the processor 650 includes logic that is capable of executing Java instructions. Other components of the image forming device 600 are not described herein but may include media handling and storage mechanisms, sensors, controllers, and other components involved in the imaging process.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A method for managing the health of memory in a computing system, the method being performable by a logic with bus master capability in the computing system, the logic being configured to selectively operate independently of an operating system and a processor associated with the computing system, the method comprising:
   accessing a memory map associated with the computing system;
   selectively checking a memory location identified in the memory map for a correctable single bit memory error;
   upon detecting a correctable single bit error, selectively causing a corrected data to be written back to the memory location; and
   upon determining that a likelihood that the memory location will experience a memory failure exceeds a threshold, selectively causing data stored in the memory location to be relocated and to make the memory location logically inaccessible to the computing system.

2. The method of claim 1, including:
   selectively manipulating a non-volatile memory location to record the detecting of the correctable single bit error; and
   notifying the operating system concerning the detecting of the correctable single bit error.

3. The method of claim 1, the logic being processor load aware.

4. The method of claim 1, the logic being an embedded management controller comprising one of, a management processor (MP), an integrated lights out (iLO) logic, and a baseboard management controller (BMC).

5. The method of claim 1, the method being user configurable with respect to one or more of, a memory checking protocol, a write back protocol, threshold configuration, and a data relocation protocol.

6. The method of claim 1, where selectively checking the memory location is performed one or more of, periodically, constantly, substantially constantly, according to a configurable schedule, and in response to a user command.

7. The method of claim 1, including accessing the memory map at boot time.

8. The method of claim 7, including accessing the memory map as part of an option ROM (read only memory) power on self test (POST).

9. The method of claim 7, where accessing the memory map includes accessing a BIOS (Basic Input Output System) associated with the computing system.

10. The method of claim 1, where checking the memory location for a correctable single bit memory error includes one or more of, analyzing a parity bit, analyzing an error correcting code (ECC) bit, and performing a memory read with ECC bit validation.

11. The method of claim 1, where the corrected data is written back to the memory location in response to one or more of, a ROM (read only memory) SMI (system management interrupt) and an action by a chipset associated with the computing system.

12. The method of claim 1, the threshold concerning one or more of, a number of errors experienced by the memory location, a number of errors experienced by a chip on which the memory location is implemented, an error frequency, and a change in the error frequency.

13. The method of claim 1, the logic being incorporated into one or more of, a computer, a printer, a camera, a telephone, and a personal digital assistant (PDA).

14. The method of claim 1, where the memory described by the memory map includes one or more of, interleaved memory, and aliased memory.

15. A method for managing the health of memory in a computing system, the method being performable by a logic with bus master capability in the computing system, the logic being configured to selectively operate independently of an operating system and a processor associated with the computing system, the method comprising:

accessing a memory map associated with the computing system;

selectively checking a memory location identified in the memory map for a correctable single bit memory error, where checking the memory location for a correctable single bit memory error includes one or more of, analyzing a parity bit, analyzing an error correcting code (ECC) bit, and performing a memory read with ECC bit validation, the checking being performed one or more of, periodically, constantly, substantially constantly, according to a configurable schedule, and in response to a user command;

upon detecting a correctable single bit error, selectively causing a corrected data to be written back to the memory location;

upon determining that a likelihood that the memory location will experience a memory failure exceeds a threshold, selectively causing data stored in the memory location to be relocated and to make the memory location logically inaccessible to the computing system, where the threshold concerns one or more of, a number of errors experienced by the memory location, a number of errors experienced by a chip on which the memory location is implemented, an error frequency, and a change in the error frequency;

selectively manipulating a non-volatile memory location to record the detecting of the correctable single bit error; and notifying the operating system concerning the detecting of the correctable single bit error.

16. A computer-readable medium storing processor executable instructions operable to perform a method for managing the health of memory in a computing system, the method being performable by a logic with bus master capability in the computing system, the logic being configured to selectively operate independently of an operating system and a processor associated with the computing system, the method comprising:

accessing a memory map associated with the computing system;

selectively checking a memory location identified in the memory map for a correctable single bit memory error;

upon detecting a correctable single bit error, selectively causing a corrected data to be written back to the memory location; and upon determining that a likelihood that the memory location will experience a memory failure exceeds a threshold, selectively causing data stored in the memory location to be relocated and to make the memory location logically inaccessible to the computing system.

17. A method, comprising:

booting a computing system;

constructing a physical memory map for the computing system;

loading an operating system into physical memory in the computing system based, at least in part, on the physical memory map;

receiving an identification of an affected memory location that is predicted to experience a memory failure, the identification being received from a logic that is not part of a processor in the computing system, the logic being configured with bus master capability in the computing system;

determining a range of physical memory addresses associated with the affected memory location;

allocating a set of memory locations to receive data stored in the range of physical memory addresses associated with the affected memory location;

relocating data from the range of physical memory addresses associated with the affected memory location to the set of memory locations;

remapping the range of physical memory addresses to the set of memory locations; and making a relocation data available to the ROM BIOS to facilitate excluding the range of physical memory addresses from the physical memory map on a subsequent system boot.

* * * * *